(12) United States Patent
Nomura

(10) Patent No.: US 7,816,748 B2
(45) Date of Patent: Oct. 19, 2010

(54) SEMICONDUCTOR DEVICE AND METHOD FOR MANUFACTURING SAME

(75) Inventor: Yoji Nomura, Mizuho (JP)

(73) Assignee: Sanyo Electric Co., Ltd., Moriguchi-shi (JP)

(*) Notice: Subject to any disclaimer, the term of this patent is extended or adjusted under 35 U.S.C. 154(b) by 77 days.

(21) Appl. No.: 11/707,076

(22) Filed: Feb. 16, 2007

(65) Prior Publication Data

US 2007/0194396 A1 Aug. 23, 2007

(30) Foreign Application Priority Data

Feb. 21, 2006 (JP) ............................. 2006-043827

(51) Int. Cl.
  *H01L 27/14* (2006.01)
  *H01L 31/062* (2006.01)
(52) U.S. Cl. ..................... 257/431; 257/292
(58) Field of Classification Search ............... 257/292, 257/431, 433, 434, E27.132, E27.133
See application file for complete search history.

(56) References Cited

U.S. PATENT DOCUMENTS

| | | | |
|---|---|---|---|
| 5,552,616 A * | 9/1996 | Kobayashi | 257/184 |
| 6,861,686 B2 | 3/2005 | Lee et al. | |
| 2004/0140564 A1 * | 7/2004 | Lee et al. | 257/758 |
| 2007/0072326 A1 * | 3/2007 | Zheng et al. | 438/48 |

FOREIGN PATENT DOCUMENTS

KR 2004-0065963 7/2004

\* cited by examiner

*Primary Examiner*—Hung Vu
(74) *Attorney, Agent, or Firm*—Oliff & Berridge, PLC (57) ABSTRACT

The absorption of moisture from a wall surface of an apertured part formed in an interlayer insulating film in accordance with a light-receiving part of a light detector is minimized and deterioration of wiring in the interlayer insulating film is prevented. A position that corresponds to a light-receiving part 52 of a wiring-structure layer 90 obtained by layering an Al layer and an interlayer insulating film composed of SOG or another material is etched, and an apertured part 120 is formed. A silicon nitride film 130 is then deposited on a side-wall surface and bottom surface of the apertured part 120 via CVD. The silicon nitride layer 130 prevents moisture from infiltrating the wiring-structure layer 90.

6 Claims, 7 Drawing Sheets

SEMICONDUCTOR DEVICE AND METHOD FOR MANUFACTURING SAME

CROSS-REFERENCE TO RELATED APPLICATION

The priority application number JP2006-043827 upon which this patent application is based is hereby incorporated by reference.

FIELD OF THE INVENTION

The present invention relates to a semiconductor device in which a light-receiving part and a circuit part are positioned adjoining one another on a shared semiconductor substrate and to a method for manufacturing same; and in particular relates to an apertured part for gathering incident light to a light-receiving part and that is provided to a wiring-structure layer that is laminated on a semiconductor substrate.

DESCRIPTION OF THE PRIOR ART(S)

In recent years, optical disks such as CDs (Compact disks) and DVDs (Digital versatile disks) have come to occupy an important position as information recording media. In devices for reading these optical disks, laser light is emitted along tracks on the optical disk, and the light reflected is detected by an optical pickup mechanism. Recorded data is then read based on changes in the intensity of the reflected light.

Since the data rate for reading from optical disks is extremely high, the light detector for detecting the reflected light is composed of a semiconductor device that uses a PIN photodiode having a high response rate. The weak photoelectric conversion signal generated by the light-receiving part of the semiconductor device is amplified by an amplifier and then output to a subsequent signal-processing circuit. The length of wiring between the light-receiving part and amplifier is therefore reduced as much as possible in order to maintain the frequency characteristics of the photoelectric conversion signal and to minimize the superposition of noise. The light-receiving part and the circuit part, including the amplifier and the like, are preferably formed on the same semiconductor chip because of these issues and also from the standpoint of reducing the cost of manufacturing the light detector.

Figure 1:
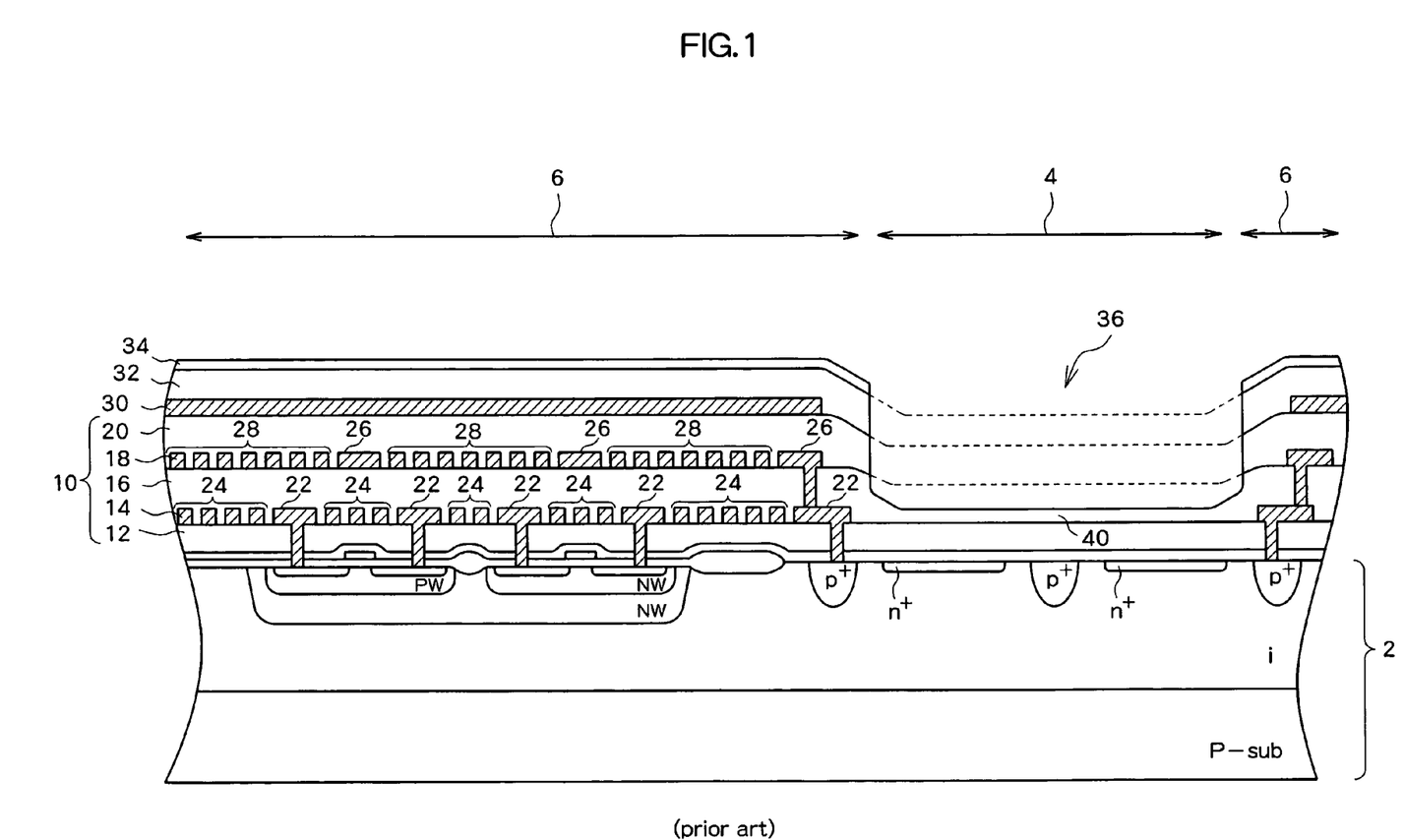
FIG. 1 is a schematic cross-sectional view showing the structure of a light-receiving part and a circuit part of a conventional light detector.

FIG. 1 is a schematic cross-sectional view of a light detector in which the light-receiving part and the circuit part are positioned adjoining one another on the same semiconductor substrate. A PIN-photodiode structure is formed on a semiconductor substrate 2 in a region that corresponds to a light-receiving part 4. Transistors and other circuit elements are formed in a region corresponding to a circuit part 6.

The light detector of FIG. 1 has a wiring structure. A first interlayer insulating film 12, a first aluminum (Al) layer 14, a second interlayer insulating film 16, a second Al layer 18, and a third insulating film 20 are sequentially layered on the semiconductor substrate 2 as a wiring-structure layer 10. The first Al layer 14 and second Al layer 18 are each patterned using photolithography techniques. For example, a wiring 22 and a planarizing pad 24 are formed on a circuit part 6 by the first Al layer 14, and a wiring 26 and a planarizing pad 28 are formed on the circuit part 6 by the second Al layer 18.

The planarizing pads 24, 28 are positioned in gaps in the wirings 22, 26, respectively, and surface roughness is reduced on the interlayer insulating films 16, 20 that are layered on the first Al layer 14 and second Al layer 18, respectively.

An Al layer 30 for blocking light is layered on the wiring-structure layer 10 of the circuit part 6. A silicon oxide film 32 and a silicon nitride film 34 are sequentially layered thereon as a protective film.

The interlayer insulating films are formed using SOG (spin on glass), BPSG (borophosphosilicate glass), or TEOS (tetra-ethoxy-silane). These materials absorb moisture that causes deterioration in the Al wiring. Silicon nitride films are less prone to absorbing moisture. The silicon nitride film 34 deposited on the interlayer insulating film conventionally functions as a film for keeping moisture from the interlayer insulating film beneath.

The wiring-structure layer 10 is also layered on the semiconductor substrate 2 of the light-receiving part 4. The aforementioned Al layers are removed from the light-receiving part 4 by patterning, and the interlayer insulating films 12, 16, 20, and the like are layered on the light-receiving part 4.

The wiring-structure layer 10 of the light-receiving part 4 is etched and an apertured part 36 is formed in order to increase the efficiency of light incidence on the semiconductor substrate 2 of the light-receiving part 4. For example, only part of the thickness of the interlayer insulating films can be allowed to remain at the bottom of the apertured part 36. The wiring-structure layer 10 is thus made thinner by etching at the light-receiving part 4, whereby the transmittance of light to the semiconductor substrate 2 is improved, and the photoelectric conversion signal can be maintained according to the reflected laser light. The portions of the layers removed by etching on the light-receiving part 4 are indicated by the dotted lines in FIG. 1. The interlayer insulating film remaining after etching forms a protective layer 40 on the surface of the light-receiving part 4.

When the apertured part 36 has been formed on the wiring-structure layer 10 in a region that corresponds to the light-receiving part 4, moisture will be absorbed from the interlayer insulating film exposed therein. In particular, problems arise in that, since a side wall of the apertured part 36 adjoins the circuit part 6, moisture absorbed from this portion quickly causes the wiring to deteriorate.

SUMMARY OF THE INVENTION

The present invention was devised in view of the foregoing problem and provides a semiconductor device in which deterioration in wiring of a circuit part positioned adjoining a light-receiving part is minimized, as well as a method for manufacturing same.

The present invention provides a semiconductor device in which a light-receiving part and a circuit part are positioned adjacent to one another on a shared semiconductor substrate, the device comprising a multilayer wiring-structure layer that is layered on the semiconductor substrate and includes metal wiring and an interlayer insulating layer that constitute the circuit part; an apertured part in the wiring-structure layer formed in a position of the light-receiving part; and a moisture-proof film for covering a side-wall surface of the apertured part.

The present invention also provides a method for manufacturing a semiconductor device in which a light-receiving part and a circuit part are positioned adjacent to one another on a shared semiconductor substrate, the method comprising a step of forming a wiring-structure layer in which a wiring-structure layer composed of metal wiring formed on at least the circuit part, and an interlayer insulating film formed on an entire surface of the semiconductor substrate is layered on the semiconductor substrate; a step of forming an apertured part in which the wiring-structure layer is etched in an area that corresponds to the light-receiving part, and an apertured part is formed; and a step of forming a moisture-proof film in which a moisture-proof film is deposited on a side-wall surface of the apertured part.

DESCRIPTION OF THE PREFERRED EMBODIMENTS

Embodiments of the present invention shall be described below with reference to the drawings.

First Embodiment

The first embodiment is a light detector for mounting on a light-pickup mechanism of a device for reading optical disks such as CDs and DVDs.

Figure 2:
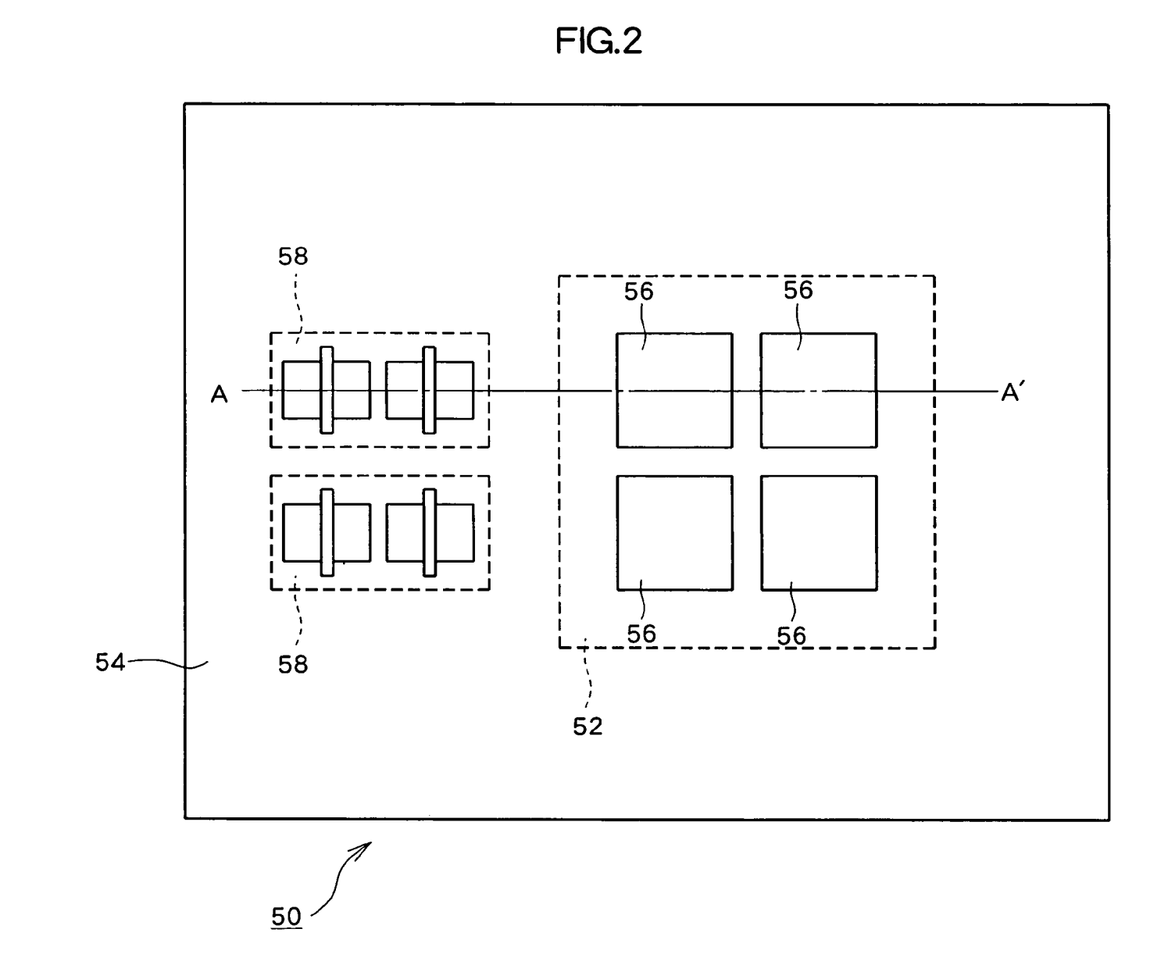
FIG. 2 is a schematic plan view of a semiconductor device that acts as a light detector according to the present embodiments.

FIG. 2 is a schematic plan view of a semiconductor device that acts as the light detector according to the present embodiment. This light detector 50 is formed on a silicon semiconductor substrate. The light detector 50 is composed of a light-receiving part 52 and a circuit part 54. The light-receiving part 52 comprises, e.g., four PIN photodiodes (PD) 56 in a 2×2 arrangement, and in four partitioned segments receives light incident on the surface of the substrate from an optical system. The circuit part 54 is positioned, e.g., around the light-receiving part 52. A CMOS 58, for example, and other circuit elements are formed on the circuit part 54. A circuit for amplifying output signals from the light-receiving part 52 and other signal-processing circuits can be formed on the same semiconductor chip as the light-receiving part 52 using the circuit elements of the circuit part 54. Wiring connected to the circuit elements and wiring connected to a diffusion layer constituting the light-receiving part 52 are positioned on the circuit part 54 (this wiring is not shown in FIG. 2). This wiring is formed by patterning the Al film layered on the semiconductor substrate.

Figure 3:
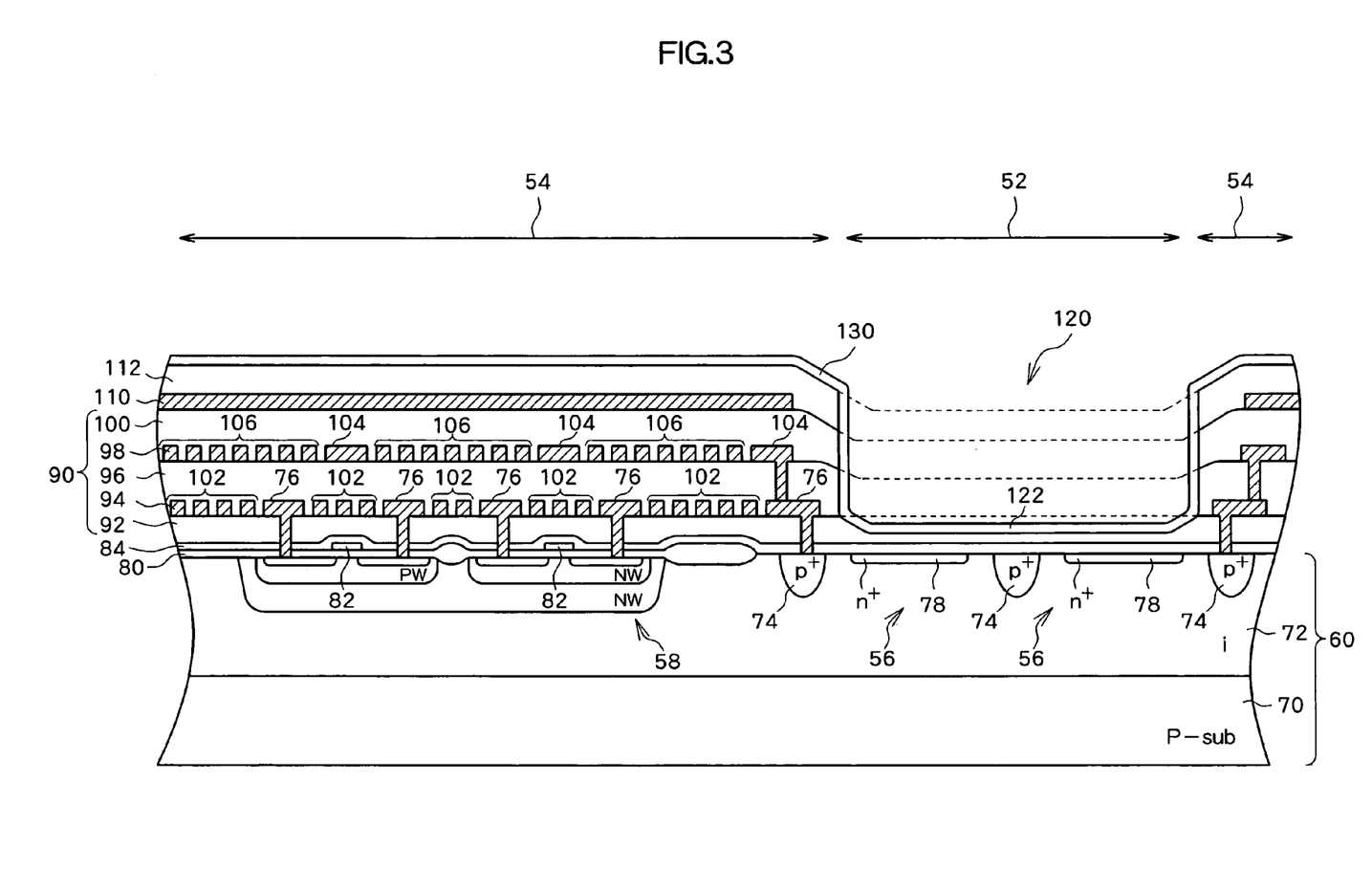
FIG. 3 is a schematic cross-sectional view showing the structure of a light-receiving part and a circuit part of a light detector of a first embodiment.

FIG. 3 is a schematic cross-sectional view showing the structure of the light-receiving part 52 and the circuit part 54 in a cross section perpendicular to the semiconductor substrate along the straight line A-A' shown in FIG. 2. The cross section shows two PDs 56 of the light-receiving part 52, the CMOS 58 of the circuit part 54, the wiring and the interlayer insulating films layered on a semiconductor substrate 60 on which the above components are formed, and other structures are shown in this cross section.

The light-receiving part 50 is produced using the semiconductor substrate 60, wherein an epitaxial layer 72 having a lower impurity concentration and a higher specific resistance than a P-sublayer 70 is built up on the P-sublayer 70, which is a p-type silicon substrate into which a p-type impurity has been introduced. The P-sublayer 70 constitutes a common anode with the PDs 56 and, for example, applies a grounding potential from a rear surface of the substrate. An isolated region 74 applies a grounding potential via a wiring 76, which is provided to the surface of the substrate, and constitutes a common anode with the P-sublayer 70.

In the light-receiving part 52, the epitaxial layer 72 constitutes an i layer of the PD 56, and the aforedescribed isolated region 74 and a cathode region 78 are formed on the surface of the epitaxial layer 72.

A silicon oxide film 80 comprising a gate oxide film and a local oxide film (LOCOS) is formed on the surface of the semiconductor substrate 60. A gate electrode 82 composed of the MOSFET that constitutes the CMOS 58 or the like is formed on the gate oxide film using, e.g., polysilicon or tungsten (W). A silicon oxide film 84 is formed on the surface of the substrate and covers the gate electrode 82.

The wiring structure, the protective film, and other structures are formed on the semiconductor substrate upon which the PDs 56, the CMOS 58, and other circuit-element structures are formed. The wiring of the light detector 50 has a two-layer structure. A first interlayer insulating film 92, a first Al layer 94, a second interlayer insulating film 96, a second Al layer 98, and a third interlayer insulating film 100 are sequentially layered on the semiconductor substrate 60 as a wiring-structure layer 90. The first Al layer 94 and second Al layer 98 are patterned using photolithography techniques. For example, the wiring 76 and a planarizing pad 102 are formed on the circuit part 54 by the first Al layer 94, and a wiring 104 and a planarizing pad 106 are formed on the circuit part 54 by the second Al layer 98.

The planarizing pads 102, 106 are positioned in gaps in the wiring 76, 104, respectively, and surface roughness is minimized on the surfaces of the interlayer insulating films 96, 100, which are layered on the first Al layer 94 and second Al layer 98, respectively. The interlayer insulating films are formed using SOG, BPSG, or TEOS.

An Al layer 110 for blocking light is layered on the wiring-structure layer 90 of the circuit part 54, and a silicon oxide film 112 is further layered thereon as a protective film.

The wiring-structure layer 90 and the layers thereon are etched back and an apertured part 120 is formed in a region corresponding to the light-receiving part 52 in order to increase the efficiency of light incidence on the PD 56 of the light-receiving part 52. A thin residue of the interlayer insulating film that constitutes the wiring-structure layer 90 is left on the bottom of the apertured part 120 as a protective layer 122 for the surface of the semiconductor substrate 60 of the light-receiving part 52. The wiring-structure layer 90 is thus etched and the apertured part 120 is provided in the light-receiving part 52, whereby the transmittance of light to the PD 56 is improved, and the amplitude of the photoelectric conversion signal can be maintained according to the reflected laser light. The portions of the layers removed by etching on the light-receiving part 52 are indicated by dotted lines in FIG. 3.

After the apertured part 120 has been formed on the light detector 50, a silicon nitride film 130 is deposited. Along with the silicon oxide film 112, the silicon nitride film 130 constitutes a protective film on the upper surface of the light detector 50 and covers the interlayer insulating film that is exposed on the side-wall and bottom surfaces of the apertured part 120. The silicon nitride film 130 prevents the absorption of moisture, minimizes the infiltration of moisture into the wiring-structure layer 90 from the side-wall and bottom surfaces of the apertured part 120, and prevents deterioration of the wiring 76, 104.

Figure 4A:
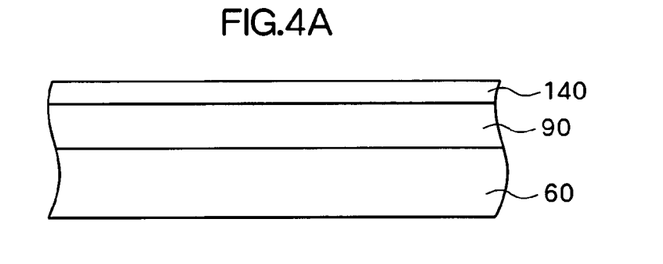
FIGS. 4A through 4D are schematic views showing the cross-sectional structures during the major steps for forming an apertured part in the light detector of the first embodiment.

A method for manufacturing the light detector 50 shall be described next using FIGS. 4A through 4D. FIGS. 4A through 4D are schematic diagrams that describe a method for forming the apertured part 120 that is characteristic of the method for manufacturing the light detector 50 and that show schematic cross-sectional views of the vicinity of the light-receiving part 52 during the major steps. Once the above-described PDs 56, CMOS 58, and other components have been formed on the semiconductor substrate 60, the wiring-structure layer 90 is layered thereon, and an upper layer 140, which comprises the light-blocking Al layer 110 and the silicon oxide film 112, is further deposited thereon (FIG. 4A). These layers are deposited using CVD (chemical vapor deposition) or PVD (physical vapor deposition).

Figure 4B:
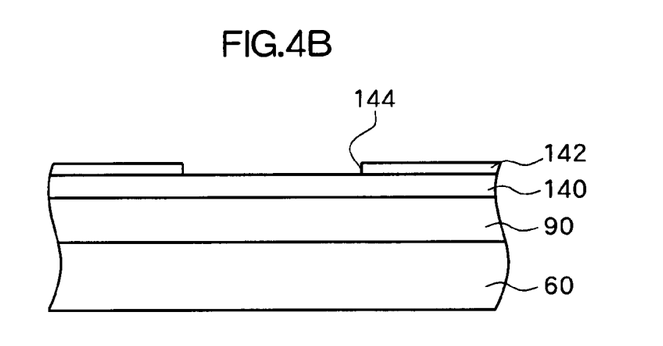

A photoresist 142 is then applied to the surface of the upper layer 140. The portion of the photoresist 142 that corresponds to the position of the light-receiving part 52 is removed by light exposure using a photo mask or by another series of lithography steps, and an aperture 144 for the photoresist 142 is formed at this position (FIG. 4B).

Figure 4C:
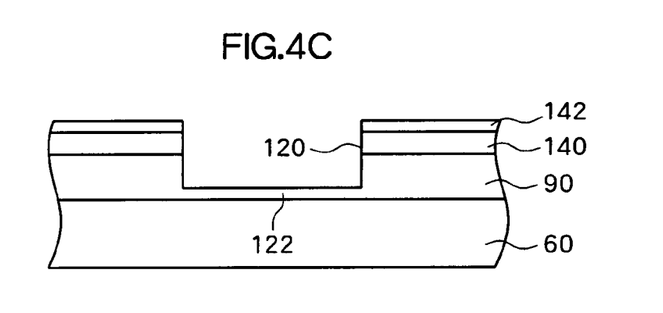

The upper layer 140 and the wiring-structure layer 90 are etched while the photoresist 142 acts as a mask, forming the apertured part 120. The etching can be performed anisotropically using, e.g., a dry etching technique. The depth of the apertured part 120 can be adjusted according to the etching time and other conditions and is controlled so that the interlayer insulating film has a thickness that is suitable for the protective layer 122 at the bottom (FIG. 4C).

Figure 4D:
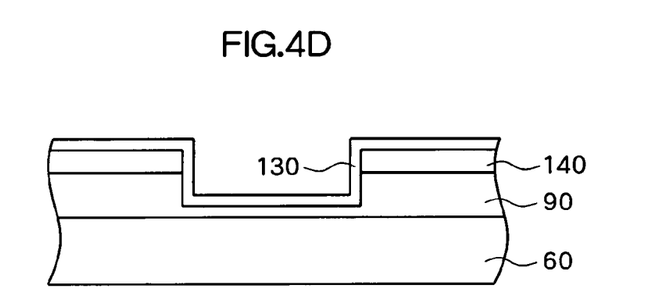

Once the photoresist 142 has been removed, the silicon nitride film 130 is formed. Methods and conditions having suitable step coverage are utilized, whereby the silicon nitride film 130 can be properly built up on the side-wall surface of the apertured part 120. The silicon nitride film 130 is thereby formed on the surface of the upper layer 140 as well as on the side-wall and bottom surfaces of the apertured part 120 (FIG. 4D). The silicon nitride layer 130 is deposited via, e.g., CVD.

Adjusting the thickness of the silicon nitride film 130 covering the bottom surface of the apertured part 120 will enable the silicon nitride film 130 to function as an antireflective film, which minimizes the reflection of incident light from the bottom surface of the apertured part 120 to the PDs 56, in addition to functioning as a moisture-proof film. The thickness for a silicon nitride film 130 that is suitable as an antireflective film is set in accordance with the wavelength of the laser light to be detected by the light detector 50. For example, the laser light used for CDs and DVDs has wavelengths in the 780-nm and 650-nm bands. The thickness of the silicon nitride film 130 is set to a value that corresponds to, e.g., ¼ of the wavelength of the laser light, whereby the antireflective effect is obtained.

Second Embodiment

Figure 5:
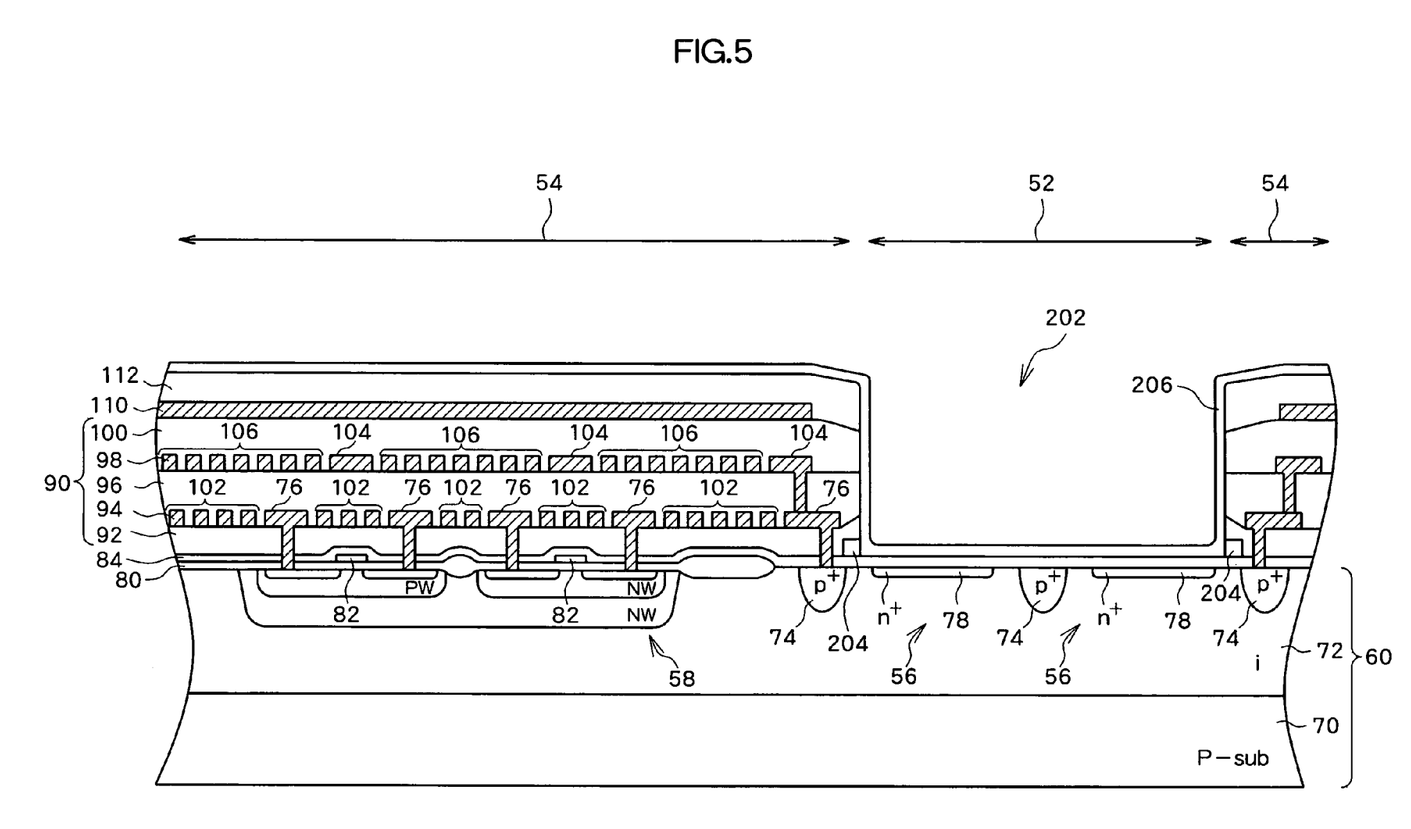
FIG. 5 is a schematic cross-sectional view showing the structure of a light-receiving part and a circuit part of a light detector of a second embodiment.

A second embodiment of the present invention is a light detector similar to the first embodiment. Structural elements that are similar to the first embodiment are denoted by the same symbols hereunder, and descriptions thereof shall be omitted. Reference can be made to FIG. 2 for a plan view of the present light detector. FIG. 5 is a schematic cross-sectional view showing the structures of the light-receiving part 52 and the circuit part 54 of the present light detector 50 in a cross section perpendicular to the semiconductor substrate along the straight line A-A' shown in FIG. 2. The light detector 50 of the present embodiment primarily differs from the light detector 50 of the first embodiment in terms of the structure of the apertured part formed in the light-receiving part 52. This point shall be described below.

The silicon oxide film 80 comprising a gate oxide film and a LOCOS is formed on the surface of the semiconductor substrate 60 of the light detector 50 of the present embodiment in the same manner as in the first embodiment. A gate electrode 82 composed of the MOSFET that constitutes the CMOS 58 or the like is formed on the gate oxide film. The silicon oxide film 84 is formed on the surface of the substrate so as to cover the gate electrode 82.

Once the silicon oxide film 84 has been formed, a polysilicon film is formed at a position that corresponds to the light-receiving part 52. As shall be described below, the polysilicon film is used as an etching stopper when the wiring-structure layer 90 is etched to form an apertured part 202 at the position of the light-receiving part 52. The polysilicon film is therefore formed expanding outward past the aperture of the apertured part 202. Once the polysilicon film has been formed, the wiring-structure layer 90 and the upper layer 140 are sequentially layered as in the first embodiment.

The aforementioned polysilicon film, which is positioned below the wiring-structure layer 90, is etched in the step for forming the apertured part 202, and a portion of the polysilicon film is removed at the bottom surface of the apertured part 202. The portion of the polysilicon film on the bottom surface of the apertured part 202 is therefore not present in FIG. 5, and only a portion 204 expanding outward past the apertured part 202 remains.

In the light detector 50, a silicon nitride film 206 is formed that covers the interlayer insulating film exposed on the side-wall surface of the apertured part 202. The silicon nitride film 206 minimizes the infiltration of moisture into the wiring-structure layer 90 from the side-wall surface of the apertured part 202 and prevents deterioration of the wiring 76, 104, as does the silicon nitride film 130. The silicon nitride film 206 is formed so as to also cover the upper surface of the silicon oxide film 112 and the bottom surface of the apertured part 202.

Figure 6A:
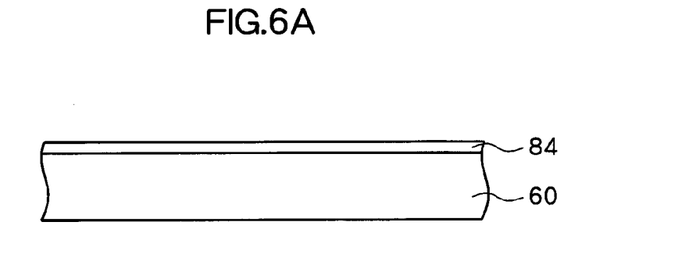
FIGS. 6A through 6D are schematic diagrams showing the cross-sectional structures during the major steps for forming an apertured part in the light detector of the second embodiment.

A method for manufacturing the light detector 50 shall next be described using FIGS. 6A through 6D and FIGS. 7A through 7C. FIGS. 6A through 6D and FIGS. 7A through 7C are schematic views that describe a method for forming the apertured part 202 that is characteristic of the method for manufacturing the present light detector, and that show schematic cross-sectional views of the vicinity of the light-receiving part 52 during the major steps. The silicon oxide film 84 is formed on the semiconductor substrate 60 on which the aforedescribed PDs 56, CMOS 58, and the like are formed (FIG. 6A). The silicon oxide film 84 is deposited by, e.g., CVD.

Figure 6B:
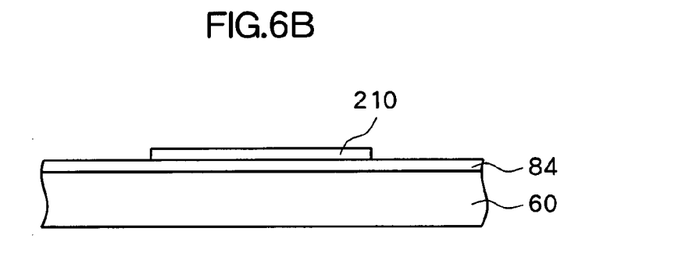

The polysilicon film is formed on the silicon oxide film 84 by CVD or the like. The polysilicon film is patterned by photolithography techniques, and a polysilicon film 210 is left at a position that corresponds to the light-receiving part 52 (FIG. 6B). The polysilicon film 210 is formed having a shape and size that form a margin with the expected shape of the aperture of the apertured part 202 so that the polysilicon film 210 will be able to reliably function as an etching stopper when the apertured part 202 is etched. Specifically, the shape and size of the polysilicon film 210 are set with consideration given to the positional accuracy (alignment accuracy) of the etching mask and the machining accuracy of the etching itself while the apertured part 202 is etched, so that the aperture of the apertured part 202 that reaches the polysilicon film 210 will be enveloped within the surface of the polysilicon film 210.

In the light-receiving part 52, the wiring-structure layer 90 does not include the first Al layer 94 and second Al layer 98, and the upper layer 140 does not include the light-blocking Al layer 110. The thickness of the wiring-structure layer 90 and the upper layer 140 is therefore thinner at the light-receiving part 52 than at the circuit part 54. The thickness of the polysilicon film 210 can be established so as to compensate for the difference between the thicknesses of the wiring-structure layer 90 and the upper layer 140 in the light-receiving part 52 and in the circuit part 54. The layers deposited as the wiring-structure layer 90 and the upper layer 140 can thereby be inhibited from sinking into the light-receiving part 52, and the flatness of the layers can be improved. As a result, the removal by etching of the Al layers from the light-receiving part 52 and the etchback of the apertured part 202, for example, can be properly performed.

Figure 6C:
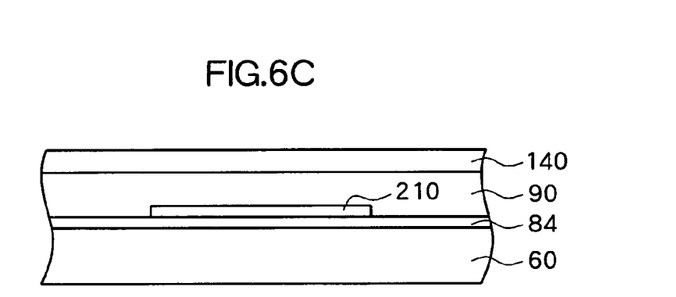

Once the polysilicon film 210 has been formed, the wiring-structure layer 90 and the upper layer 140 are sequentially layered thereon (FIG. 6C).

Figure 6D:
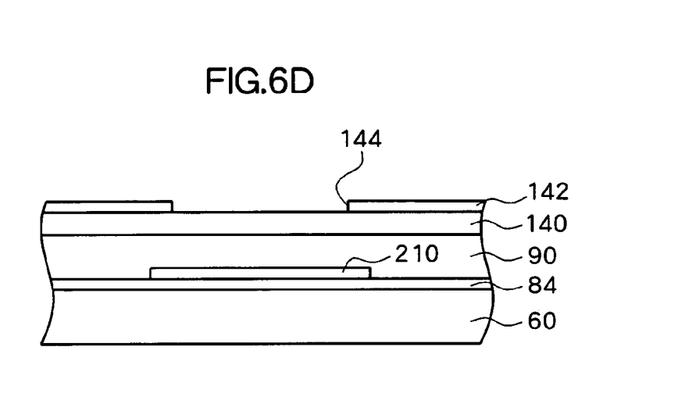

The photoresist 142 is then applied to the surface of the upper layer 140. The portion of the photoresist 142 that corresponds to the position of the light-receiving part 52 is removed in the same manner as the first embodiment, and the aperture 144 of the photoresist 142 is formed at that position (FIG. 6D).

Figure 7A:
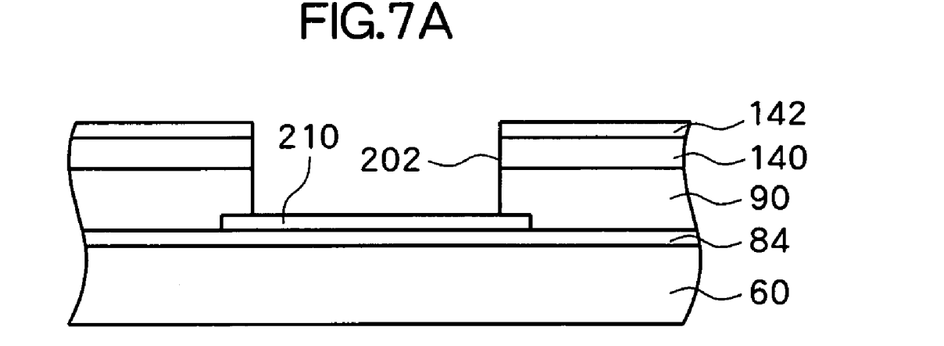
FIGS. 7A through 7C are schematic diagrams showing cross-sectional structures during the major steps for forming an apertured part in the light detector of the second embodiment.

The upper layer 140 and wiring-structure layer 90 are etched while the photoresist 142 acts as a mask. The etching can be performed anisotropically using, for example, a dry etching technique. The type of etching and the conditions under which the etching is performed are chosen so that the etching selectivity is maintained for the SOG or other material that constitutes the wiring-structure layer 90 of the light-receiving part 52 on the polysilicon film 210, allowing the polysilicon film 210 to act as an etching stopper. This etching will hollow out the apertured part 202 down to the upper surface of the polysilicon film 210 (FIG. 7A).

Figure 7B:
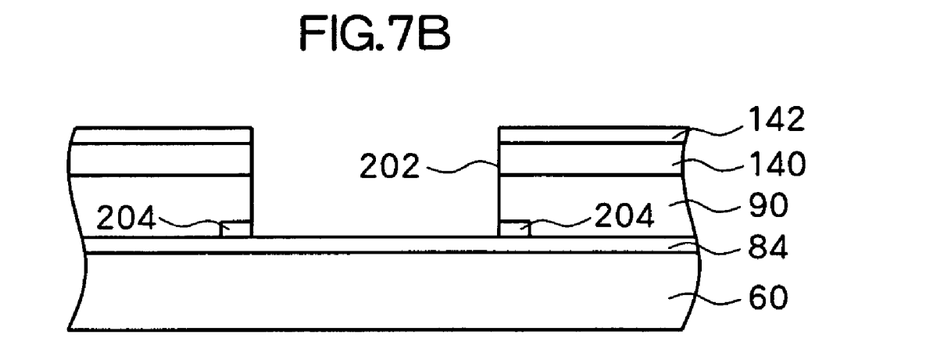

The polysilicon film 210 is etched using the photoresist 142 as a mask. This etching can also be performed anisotropically using a dry etching technique. However, the etchant or other components used may be different from those used in the etching of the SOG or other material that constitutes the wiring-structure layer 90. In other words, the polysilicon film 210 is etched using a type of etching and under etching conditions in which selectivity is maintained for the silicon oxide film 84 formed below the polysilicon film 210, allowing the silicon oxide film 84 to act as an etching stopper. This etching will hollow out the apertured part 202 down to the upper surface of the silicon oxide film 84 (FIG. 7B).

Figure 7C:
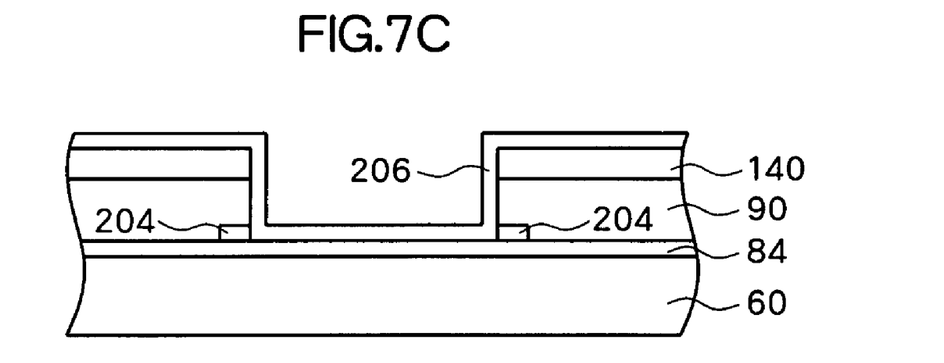

Once the layers have been etched back to form the apertured part 202, the photoresist 142 is removed. Silicon nitride is then deposited using, e.g., CVD, and the silicon nitride film 206 is formed on the surface of the upper layer 140 as well as on the side-wall and bottom surfaces of the apertured part 202 (FIG. 7C). The side-wall and bottom surfaces of the apertured part 202 are thereby covered by the silicon nitride film 206.

The silicon nitride film 206 that covers the side-wall surface of the apertured part 202 thus minimizes the infiltration of moisture into the wiring-structure layer 90 and prevents the deterioration of the wiring 76, 104. The silicon nitride film 206 that covers the bottom surface of the apertured part 202 also functions as an antireflective film for minimizing the reflection of incident light from the bottom surface of the apertured part 202 to the PDs 56. The thickness for a silicon nitride film 206 that has a suitable antireflective function is set in accordance with the wavelength of the laser light to be detected by the present light detector, as described in the first embodiment. In the present configuration, the silicon oxide film 84 and the silicon nitride film 206 are situated on the PD 56, and the two films work together to achieve an antireflective function. For example, a suitable thickness for the silicon nitride film 206 at the bottom surface is set in accordance with the index of refraction of the silicon nitride film 206 and the index of refraction and thickness of the silicon oxide film 84.

As indicated in the first and second embodiments described above, the present invention provides a semiconductor device in which a light-receiving part and a circuit part are positioned adjacent to one another on a shared semiconductor substrate, the device comprising a multilayer wiring-structure layer that is layered on the semiconductor substrate and includes metal wiring and an interlayer insulating layer that constitute the circuit part; an apertured part in the wiring-structure layer formed in a position of the light-receiving part; and a moisture-proof film for covering a side-wall surface of the apertured part.

In another semiconductor device according to the present invention, the apertured part extends to a depth partway through the wiring-structure layer; the moisture-proof film covers the side-wall surface and bottom surface of the apertured part; and the moisture-proof film, which covers the bottom surface, can be formed so as to double as an antireflective film for preventing light that is incident through the apertured part from being reflected to the light-receiving part.

The moisture-proof film can be suitably formed from, e.g., silicon nitride.

The present invention also provides a method for manufacturing a semiconductor device in which a light-receiving part and a circuit part are positioned adjacent to one another on a shared semiconductor substrate, the method comprising a step of forming a wiring-structure layer in which a wiring-structure layer composed of metal wiring formed on at least the circuit part, and an interlayer insulating film formed on an entire surface of the semiconductor substrate is layered on the semiconductor substrate; a step of forming an apertured part in which the wiring-structure layer is etched in an area that corresponds to the light-receiving part, and an apertured part is formed; and a step of forming a moisture-proof film in which a moisture-proof film is deposited on a side-wall surface of the apertured part.

As described in the second embodiment, in another method for manufacturing a semiconductor device according to the present invention, before the step of forming the wiring structure there is a further step of forming a bottom layer in which an aperture bottom layer that acts as an etching stopper in the step of forming the apertured part is formed on the semiconductor substrate corresponding to the light-receiving part; and, after the step of forming the apertured part and before the step of forming the moisture-proof film, there is a further step of removing the bottom part of the aperture in which the bottom part of the aperture layer on the bottom surface of the apertured part is removed by etching. For example, the step of forming the polysilicon film 210 on the semiconductor substrate 60 in the second embodiment (FIG. 6B) is equivalent to the step of forming a bottom layer.

In the method for manufacturing a semiconductor substrate, the step of forming a bottom layer also is preceded by a step of forming an antireflective film before in which a film for preventing incident light toward the light-receiving part from being reflected is formed on the semiconductor substrate. The step of removing the bottom of the aperture can be performed so that the aperture bottom layer is etched with the antireflective film acting as an etching stopper. For example, the step of forming the silicon oxide film 84 on the semiconductor substrate 60 in the second embodiment (FIG. 6A) is equivalent to the step of forming an antireflective film.

In the methods for manufacturing a semiconductor device according to the present invention, the moisture-proof film can be formed from silicon nitride.

According to the present invention, the side surface of the apertured part provided to the wiring-structure layer is covered by the moisture-proof film, and the infiltration of moisture from the side surface is prevented. Deterioration in the metal wiring of the wiring structure can therefore be minimized.

The invention claimed is:

1. A semiconductor device in which a light-receiving part and a circuit part are positioned adjacent to one another on a shared semiconductor substrate, the semiconductor device comprising:
   a silicon oxide film that is formed on and in contact with a surface of the semiconductor substrate;
   an aperture bottom layer that is layered on and in contact with the silicon oxide film at a position that corresponds to the light-receiving part and is formed from polysilicon;
   a multilayer wiring-structure layer that is layered above the semiconductor substrate above which the aperture bottom layer is formed and includes metal wiring and an interlayer insulating layer that constitute the circuit part;
   an apertured part in the wiring-structure layer that is formed in a position of the light-receiving part and penetrates the wiring-structure layer to reach the silicon oxide film; and
   a moisture-proof film for covering side-wall and bottom surfaces of the apertured part.

2. The semiconductor device of claim 1, wherein
   the apertured part extends to a depth midway through the wiring-structure layer;
   the moisture-proof film covers the side-wall surface and a bottom surface of the apertured part; and
   the moisture-proof film that covers the bottom surface doubles as an antireflective film for preventing light that is incident through the apertured part from being reflected to the light-receiving part.

3. The semiconductor device of claim 2, wherein the moisture-proof film on the bottom surface of the apertured part has a thickness that corresponds to ¼ the wavelength of light that is to be detected by the light-receiving part.

4. The semiconductor device of claim 1, wherein
   the moisture-proof film that covers the bottom surface doubles as an antireflective film for preventing light that is incident through the apertured part from being reflected to the light-receiving part.

5. The semiconductor device of claim 4, wherein the moisture-proof film on the bottom surface of the apertured part has a thickness that corresponds to ¼ the wavelength of light that is to be detected by the light-receiving part.

6. The semiconductor device of claim 1, wherein the moisture-proof film is composed of silicon nitride.

* * * * *